United States Patent [19]

Meyers

[11] Patent Number: 5,517,113
[45] Date of Patent: May 14, 1996

[54] FIVE COIL MEASURING SYSTEM FOR MEASURING MAGNETIC FIELD STRENGTH EMANATING FROM A TELEPHONE HANDSET

[76] Inventor: Sharon L. Meyers, 1020 Cape Splitt Harbour, Pasadena, Md. 21122

[21] Appl. No.: 369,495

[22] Filed: Jan. 6, 1995

[51] Int. Cl.$^6$ .......................... G01R 33/02; H04M 1/24
[52] U.S. Cl. .................................. 324/260; 379/1
[58] Field of Search ...................... 324/244, 245, 324/247, 251, 252, 253, 258, 260, 261, 262; 379/1, 27, 28; 455/89, 90, 115

[56] References Cited

U.S. PATENT DOCUMENTS

| | | | |
|---|---|---|---|
| 2,261,309 | 11/1941 | Stuart, Jr. .................................. | 324/247 |
| 4,023,093 | 5/1977 | Aslan ........................................ | 324/247 |
| 4,152,555 | 5/1979 | Modesa et al. ................... | 179/175.1 A |
| 4,214,132 | 7/1980 | Kelso ....................................... | 179/175 |
| 4,602,134 | 7/1986 | Atkinson et al. ................. | 179/175.1 R |
| 4,677,379 | 6/1987 | Arnaud et al. ............................ | 324/240 |
| 4,912,755 | 3/1990 | Blood et al. ................................. | 379/6 |
| 5,191,792 | 3/1993 | Gloor ....................................... | 324/244 |
| 5,285,164 | 2/1994 | Wong ....................................... | 324/627 |
| 5,434,500 | 7/1995 | Hauck et al. ............................ | 324/260 |

*Primary Examiner*—Sandra L. O'Shea
*Assistant Examiner*—Roger Phillips
*Attorney, Agent, or Firm*—Joseph H. McGlynn

[57] ABSTRACT

A multi-coil measuring system for electronic apparatus having five pick up coils, for picking up the magnetic field intensity of the electronic apparatus, mounted in a plexiglass block which has a Velcro strap to secure the electronic apparatus to the block. The coils are electrically connected to a connector that leads to a five position switch. The switch, in turn, is electrically connected to a Spectrum Analyzer or Decibel meter. By selecting different switch positions each of the pick up coils can be individually tested without moving the electronic apparatus.

5 Claims, 1 Drawing Sheet

FIVE COIL MEASURING SYSTEM FOR MEASURING MAGNETIC FIELD STRENGTH EMANATING FROM A TELEPHONE HANDSET

BACKGROUND OF THE INVENTION

This invention relates in general to test apparatus for telephone handsets, and in particular to test apparatus to reliably measure the magnetic field intensity of telephone handset receivers.

Description of the Prior Art

The United States Congress has legislated that persons using hearing aids with magnetic pickups shall have reasonable access to the National Telephone Network. All telephones manufactured after Aug. 16, 1989 must be hearing aid compatible.

Because of legislation such as this the Federal Communications Commission, the Institute of Electrical and Electronics Engineers, Electronic Industries Association, and the telephone industry have established standards for the magnetic field intensity of a telephone handset. Every handset sold must meet these standards.

Part of the standards established are: 1) The measurement axis must be parallel to the reference axis and may be displaced from that axis by a maximum of 10 mm; and 2) The radial components of the magnetic field shall be measured at four points at 90° intervals and at a distance of 16 mm from the measurement axis.

In the past the magnetic field of telephone handsets was measured using a single probe coil that was moved to each of the five points specified in the testing standards, and a reading or measurement was made at each of the selected points.

Because of the specific distances set in the testing standards, it was critical the probe was positioned at a precise location, a reading was taken, and then the probe was moved to the next location, and, again, precisely positioned for the next reading. This process was continued until all of the required readings were taken. Manually moving the probe was time consuming and, because of the necessity of precise positioning, readings could be inaccurate if a probe was positioned even a slight distance off.

SUMMARY OF THE INVENTION

It is an object of this invention to provide a test apparatus that will automatically position a telephone handset at the precise distances required by the testing standards.

It is also an object of this invention to provide a test apparatus that will allow all the required test measurements to be made without repositioning the telephone handset.

It is also an object of this invention to provide a test apparatus that will allow standard measuring equipment to easily and reliably be connected to the test apparatus.

These and other objects and advantages of the present invention will be fully apparent from the following description, when taken in connection with the annexed drawings.

DESCRIPTION OF THE PREFERRED EMBODIMENT

Figure 1:
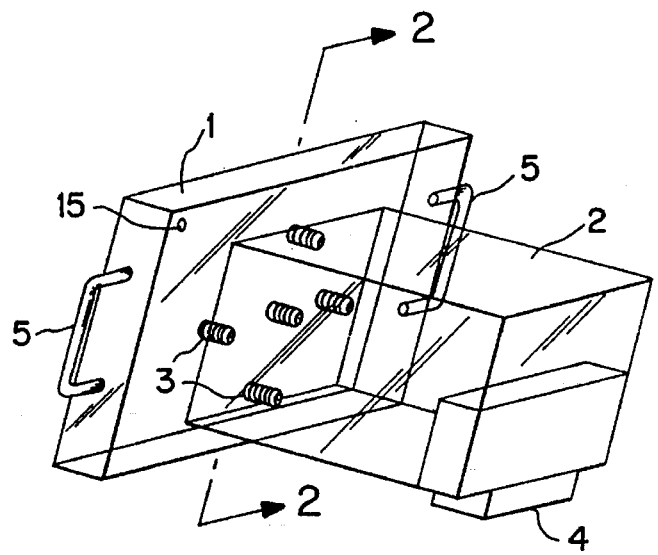
FIG. 1 shows a perspective view of the multi-coil measuring system.

The multi-coil measuring system is shown in FIG. 1, wherein a plexiglass block 1, which is approximately ½ inch thick and measures 2½ inches square, is attached to a second block 2, which is an extruded, hollow tubular piece, made of plexiglass measuring 1½ inches wide and approximately 1¾ inches square. The preferred method of attaching the blocks together is by gluing with epoxy glue, although other methods could be used.

It should be noted that the dimensions are not critical to the invention, but are merely given as an example of the dimensions that could be used. Also, it is not critical that the blocks be made of plexiglass. Other materials such as, but not limited to, plastic could also be used. If other materials are selected they should be nonconductive so the material will not interfere with the pickup coils.

Within the block 1 are embedded five telephone pickup coils 3. These coils are standard MM45 pickup coils made by Tibbetts Industries, although other coils made by other manufactures may be used. The coils 3 are mounted in the block 1, with the longitudinal axis of the coil perpendicular to the face of the block, so the distance from the center of each coil to the face of the block 1, that is opposite the block 2, is exactly 10 mm. The coils 3 are arranged so that one coil is mounted directly in the center of the block 1, and the remaining four coils are mounted in a circle the radius of which is 16 mm. Also, the remaining four coils are mounted with their centers on the circle at 90° intervals.

Figure 4:
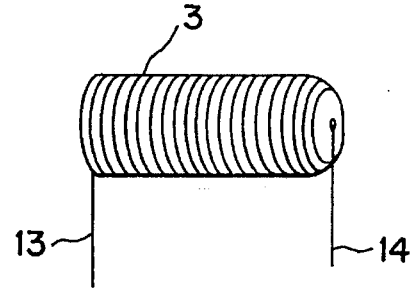
FIG. 4 shows the telephone pickup coil used in the multi-coil measuring system.

The coils may be mounted in the block 1 in various ways, such as being molded in the block or by drilling holes in the block and then gluing the coils in the block. Neither method is essential to the invention and the coils may be secured by any of the known methods. When the coil 3 (see FIG. 4) is mounted in the block 1, the lead 15 that will enter the block first can be bent back along the coil so wires 8 can be attached.

Figure 3:
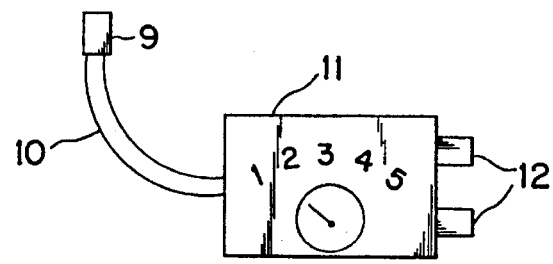
FIG. 3 shows the Velcro band attaching the telephone handset to the multi-coil measuring system.
Figure 3:
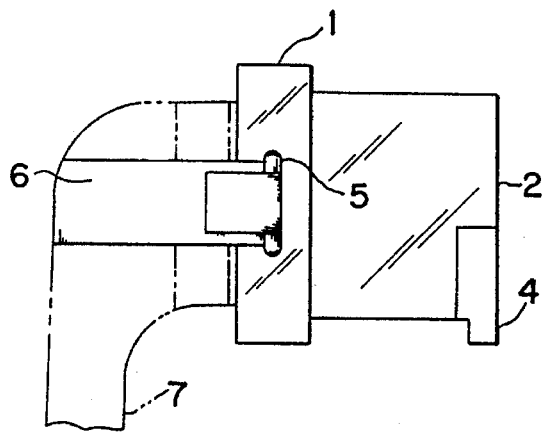

On opposite sides of block 1 are mounted plastic handles 5 which will be used to secure a Velcro strap to attach a telephone handset, as more clearly shown in FIG. 3. Also on block 1 is a black dot 13 which can be used as a reference point so a tester will know which coil is being tested. Other reference indicators, such as marking each coil "coil 1", "coil 2", etc. could also be used.

Figure 2:
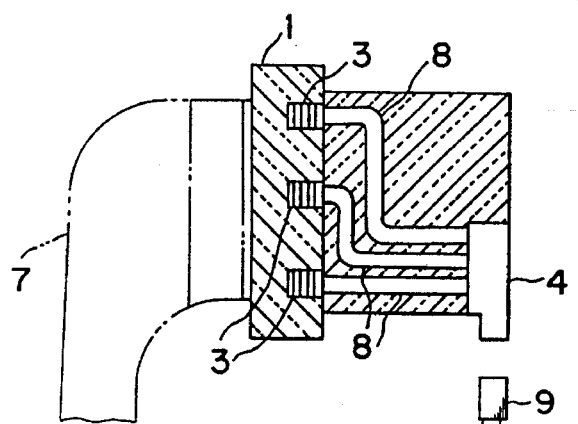
FIG. 2 shows a telephone handset connected to the multi-coil measuring system.

At the bottom of the block 2, opposite from the side attached to block 1, is a 15 pin ribbon connector. The wires 8, a pair of wires leading from each coil, are attached to pins in the connector with a non-connected pin between each pair of coil connections, to avoid interference. A 15 pin male ribbon connector 9 is wired with ten twisted pairs of wires generally indicated at 10 in FIG. 2. The other end of the wires 10 can be permanently connected to a multi-position switch 11, or another connector can be attached to the other end of wires 10 that will mate with a connector (not shown) attached to switch 11. Also attached to switch 11 are a pair of jacks 12 which will allow each coil, through the switch, to be connected to a measuring meter, such as a Sweep Spectrum Analyzer or Decibel meter.

The method of using the multi-coil measuring system is, a telephone handset 7 (see FIGS. 2 and 3) is attached to block 1 by means of a Velcro strap 6. The strap has the Velcro hooks on one side and the loops on the opposite side. The strap is looped under the handle 5 and folded so the hooks on one side of the strap will engage the loops on the other side. Then the strap is wrapped around the telephone handset and secured to the handle 5 on the opposite side of the block 1. The handset can be precisely positioned on the block 1, because the block is made from plexiglass and the handset 7 can be seen through the block. The connector 9 is mated with connector 4. If there is a detachable connector on the switch 11, it is mated with the other end of the cable 10. A meter is attached to the jacks 12. The switch 11 is set to the coil position to be tested (i.e. 1–5) and measurements are taken. Switch 11 is set to the next position and measurements are again taken. This continues until all the coils have been tested. Since the handset will not have to be moved for each new measurement, the testing of all five points can be accomplished quickly, and there will be less chance of error due to an improper positioning of the coils with respect to the handset.

Although the multi-coil measuring system and the method of using the same according to the present invention has been described in the foregoing specification with considerable details, it is to be understood that modifications may be made to the invention which do not exceed the scope of the appended claims and modified forms of the present invention done by others skilled in the art to which the invention pertains will be considered infringements of this invention when those modified forms fall within the claimed scope of this invention.

What I claim as my invention is:

1. A multi-coil measuring system for measuring the magnetic field intensity of electronic apparatus comprising:

a first member having means for picking up said magnetic field intensity of said electronic apparatus, said means for picking up said magnetic field intensity comprising five elements, one of said elements positioned on said first member, the other four of said elements positioned on said first member in a circle surrounding said first member at 90°, 180°, 270°, and 360°, said first member having means for attaching said electronic apparatus to said first member, a second member attached to said first member, electrical connector means attached to said second member, means for electrically connecting said five elements to said electrical connector means, each of said five elements being electrically connected independently of the other of said elements to said electrical connector means, electric cable means for electrically connecting said connector means to an electrical measuring meter.

2. The multi-coil measuring system for measuring the magnetic field intensity of electronic apparatus as claimed in claim 1, wherein said first and second members are made from clear plexiglass.

3. The multi-coil measuring system for measuring the magnetic field intensity of electronic apparatus as claimed in claim 1, wherein said means for attaching said electronic apparatus to said first member is a Velcro strap.

4. The multi-coil measuring system for measuring the magnetic field intensity of electronic apparatus as claimed in claim 1, wherein said first member has an indicating means for indicating one of said five elements comprising said means for picking up said magnetic field intensity.

5. The multi-coil measuring system for measuring the magnetic field intensity of electronic apparatus as claimed in claim 1, wherein a multi-position switch is electrically attached between said electric cable means and said electrical measuring meter, said multi-position switch having one position corresponding to each of said elements for picking up said magnetic field intensity, whereby each of said elements can be individually, electrically connected to said electrical measuring meter without moving said electronic apparatus by selecting the proper position on said multi-position switch.

* * * * *